(12) United States Patent
Hu et al.

(10) Patent No.: US 6,618,409 B1
(45) Date of Patent: Sep. 9, 2003

(54) PASSIVATION OF SEMICONDUCTOR LASER FACETS

(75) Inventors: Martin (Hai) Hu, Corning, NY (US);
Lyle D. Kinney, Bath, NY (US);
Emmannuel C. Onyiriuka, Painted Post, NY (US); Mike X. Ouyang, Painted Post, NY (US); Chung-en Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/564,015

(22) Filed: May 3, 2000

(51) Int. Cl.[7] .................................................. H01S 5/00
(52) U.S. Cl. .............................. 372/43; 372/44; 372/45; 372/46
(58) Field of Search ....................... 372/43–50; 257/59, 257/57, 632–763; 438/482–490

(56) References Cited

U.S. PATENT DOCUMENTS

| | | | |
|---|---|---|---|
| 3,849,738 A | | 11/1974 | Hakki ..................... 331/94.5 H |
| 3,914,465 A | | 10/1975 | Dyment et al. ................ 427/82 |
| 3,943,462 A | | 3/1976 | Thompson ............. 331/94.5 H |
| 4,095,011 A | | 6/1978 | Hawrylo et al. ............ 428/469 |
| 4,317,086 A | * | 2/1982 | Scifres et al. .................. 372/49 |
| 4,337,443 A | | 6/1982 | Umeda et al. ................. 372/49 |
| 4,527,007 A | * | 7/1985 | Fuse ........................... 136/256 |
| 4,613,556 A | * | 9/1986 | Mort et al. ................. 430/58.1 |
| 4,656,638 A | * | 4/1987 | Tihanyi et al. ................. 372/49 |
| 4,875,943 A | * | 10/1989 | Hamakawa et al. ......... 136/244 |
| 5,063,173 A | * | 11/1991 | Gasser et al. ........ 148/DIG. 65 |
| 5,144,634 A | * | 9/1992 | Gasser et al. .................. 372/49 |
| 5,243,260 A | * | 9/1993 | Vinouze et al. .......... 315/169.1 |
| 5,397,737 A | * | 3/1995 | Mahan et al. ................ 136/258 |
| 5,665,637 A | | 9/1997 | Chand ......................... 372/46 |
| 5,776,819 A | * | 7/1998 | Mahan et al. .......... 148/DIG. 1 |
| 5,834,071 A | * | 11/1998 | Lin .......................... 427/255.7 |
| 5,903,047 A | * | 5/1999 | Liao et al. ..................... 257/57 |

(List continued on next page.)

FOREIGN PATENT DOCUMENTS

| | | |
|---|---|---|
| EP | 0 416 190 A1 | 9/1989 |
| EP | 0 898 345 A2 | 6/1998 |
| JP | 11026863 | 1/1997 |
| JP | 09326531 | 12/1997 |
| WO | WO99/15934 | 4/1999 |

OTHER PUBLICATIONS

Kolbas et al., "Strained–layer InGaAs–GaAs–AlGaAs photopumped and current injection lasers," *IEEE Journal of Quantum Electronics*, vol. 24, No. 8, Aug. 1988, pp. 1605–1613.

(List continued on next page.)

*Primary Examiner*—Paul Ip
*Assistant Examiner*—Delma R. Flores Ruiz
(74) *Attorney, Agent, or Firm*—Juliana Agan

(57) ABSTRACT

A method of passivating an edge-emitting semiconductor diode laser and the resultant product. Laser bars are cleaved in air from a wafer containing multiple laser bars. The bars are placed into a vacuum processing chamber in which two steps are performed without breaking vacuum. The first step includes cleaning the facets including removing the native oxide by, for example, a low-energy ion beam or by an electron cyclotron resonance (EAR) plasma containing hydrogen and possibly argon or xenon with the bars being negatively biased. The second step includes coating the cleaned facets with a thin passivation layer of hydrogenated amorphous silicon (a-Si:H), whereby the facets are coating by the passivation layer without an intervening oxide. A low oxygen partial pressure of no more than $10^{-8}$ Torr is maintained between the cleaning and deposition, both of which preferably are done in the same chamber. Also preferably, anti-reflective or highly reflective coatings are deposited on the facets without returning the laser bars to air.

37 Claims, 1 Drawing Sheet

U.S. PATENT DOCUMENTS

| | | | | |
|---|---|---|---|---|
| 6,323,052 B1 | * | 11/2001 | Horie et al. | 438/46 |
| 6,370,177 B1 | * | 4/2002 | Genei et al. | 372/49 |
| 6,370,179 B1 | * | 4/2002 | Deppe et al. | 372/96 |
| 6,396,864 B1 | * | 5/2002 | O'Brien et al. | 372/49 |
| 6,519,272 B1 | * | 2/2003 | Baliga et al. | 372/49 |

OTHER PUBLICATIONS

Lu et al., "GaAs–oxide removal using an electron cyclotron resonance hydrogen plasma," *Applied Physics Letters,* vol. 58, No. 11, Mar. 18, 1991, pp. 1143–1145.

Horie et al., "Reliability improvement of 980nm laser diodes with a new facet passivation process," *Proceedings of the 1998 16$^{th}$ IEEE International Semiconductor Laser Conference,* Oct. 4–8, 1998, Nara, Japan, pp. 133, 134.

Kerboeuf et al., "Passivation of the facets of 980 nm GaAs pump lasers by a pulsed UV laser–assisted technique," *Journal of Electronic Materials,* vol. 28, No. 2, 1999, pp. 83–90.

* cited by examiner

PASSIVATION OF SEMICONDUCTOR LASER FACETS

BACKGROUND OF THE INVENTION

1. Field of the Invention

The invention relates generally to semiconductor lasers and related optoelectric devices. In particular, the invention relates to the formation and passivation of the facets of edge-emitting optical devices.

2. Technical Background

Semiconductor lasers have found increasing use as a source of narrow bandwidth, high-power light. In particular, semiconductor lasers based upon III-V semiconductor compounds are widely used for high-speed optical recording, high-speed printing, single-mode and multi-mode data networks, long-distance networks, local-area networks, submarine cable transmission, free-space communication, doppler optical radar, optical signal processing, high-speed optical microwave sources, pump sources for other solid-state lasers, fiber amplifiers, and medical applications including both imaging and cauterization. Many of these applications require very high optical power levels, for example, above 100 mW and sometimes several watts of optical power. One particular example of a high-power application is a diode laser emitting at 980 nm for optically pumping an erbium-doped ($Ber^{3+}$) fiber amplifier (EDNA).

One material combination of III-V semiconductors that is quite useful for near-infrared lasers includes layers of $Al_{1-x}Ga_xAs$, GaAs, and possibly other related materials grown on Galas wafers. The most prevalent configuration is an edge-emitting laser in which a substantial number of AlGaAs/GaAs layers are grown on the Galas substrate to define the diode and vertical laser structure with some kind of lateral definition of an overlying ridge or an underlying layer to define the horizontal laser structure and lateral current confinement to the laser area. Thereafter, the wafer is cleaved at parallel natural (110) cleavage planes, between which the laser waveguide runs. The two cleavage planes form the two end facets of the laser. A high reflectivity coating is usually applied to the back facet, but the inherent reflection at the front facet is sometimes sufficient to provide the required amount of reflectance and transmittance at the front facet, which both defines the front side of the optical cavity but through which some radiation is transmitted as the laser output. Indeed, it is often found necessary to coat the front facet with an anti-reflection coating (ARC) to reduce its reflectance back into the laser cavity.

Prior to the deposition of any reflectivity coating, the facets are typically coated with a passivation layer to prevent the passage of oxygen which would oxidize the laser material. Passivation layers of Si, amorphous hydrogenated silicon (a-Si:H), Ga, Sb, ZnS, and ZnSe have been promoted. Aluminum-containing layers in the diode structure are especially prone to fast oxidation. The oxidation has been shown to introduce electronic states at the semiconductor surface. It is believed that these oxidation-induced states are responsible for the irreversible destruction of the facets, especially for high-power optical outputs, by the so called catastrophic optical damage (COD) process.

For mass production of such laser diodes, it is desired to cleave the wafers in air. However, an optical chip cleaved in air oxidizes in the period before the passivation layer is deposited. Cleaving in vacuum and then depositing the passivation layer without breaking vacuum is possible but not cost effective. As a result, in commercial production, the facets are cleaned and the oxide removed prior to coating the passivation layer in a system allowing both cleaning and coating to be performed without breaking vacuum. Cleaning by ion beam irradiation or pulsed UV laser irradiation has proved relatively successful.

SUMMARY OF THE INVENTION

The invention includes a method of passivating facets of edge-emitting semiconductor lasers and similar devices to produce a device having an amorphous hydrogenated silicon (a-Si:H) passivating layer applied to an oxide-free facet. The invention is particularly useful for a high-power laser or optical amplifier formed with a multi-mode waveguide.

After the onto-electronic chip has been cleaved along its two facets, possibly while exposed to an oxidizing air environment, the chip is placed in a vacuum controlled system capable of performing several steps without breaking vacuum. The facets are cleaned with either an ion beam or a plasma of hydrogen, possibly with the addition of argon or xenon. Then, the amorphous hydrogenated silicon passivation layer is deposited, preferably by sputtering a silicon target in the presence of a hydrogen plasma. Exemplary thicknesses of the passivation layers are 10 to 50 nm.

Preferably, the cleaning and depositing steps are performed in the same chamber without moving the substrate being coated, and the hydrogen plasma is advantageously maintained during the cleaning and coating sequence.

Optical layers, such as interference mirrors and anti-reflection coatings, are deposited over the a-Si:H passivation layers. Preferably, the optical layers are also deposited in the same system without breaking vacuum.

DETAILED DESCRIPTION OF THE PREFERRED EMBODIMENTS

Figure 1:
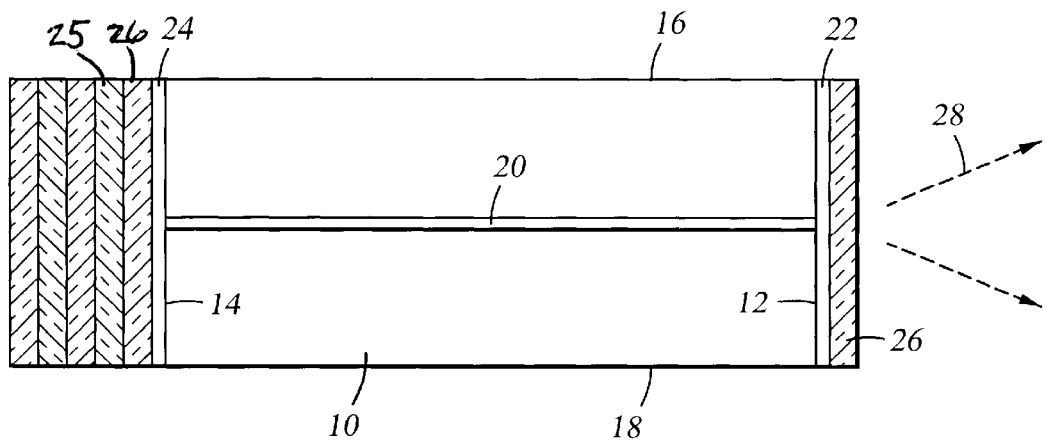
FIG. 1 is a schematic plan view of an edge-emitting semiconductor laser having facets fabricated according to the invention.

A exemplary laser of the invention is schematically illustrated in the plan view of FIG. 1. The laser is formed in a semiconductor onto-electronic chip 10 having a front facet 12 and an opposed back facet 14. The bar 10 includes a vertical structure of semiconductor layers that form the laser structure. For near-infrared lasers, the vertical structure is typically composed of layers of AlGaAs, GaAs, and related III-V semiconductor materials epitaxially deposited on a GaAs substrate. However, other other material combinations are possible within the practice of the invention. In commercial production a large number of such bars are simultaneously formed on a single GaAs wafer, and the wafer is then cleaved along natural (110) cleavage planes to form a large number of separate bars 10 having the front and back facets 12, 14 as well as the perpendicularly arranged sides 16, 18.

The semiconductor processing performed on the wafer also forms in each of the bars a waveguide structure 20 extending between and perpendicular to the facets 12, 14. The figure suggests that the waveguide structure 20 is a ridge waveguide; however, buried hetero structure waveguides are also well known to be advantageous in high-power applications. For high-power applications, the waveguide structure 20 may have a width substantially larger than the lapsing wavelength to form a broad-area laser. Typically, the waveguide structure 20 also includes unillustrated wavelength selection means such as a distributed Bragg grating. For an electrically pumped diode laser, electrical contacts and lateral current confinement structure are associated with the waveguide structure so that the biasing current is applied mostly to the area of the waveguide. These features associated with the waveguide 20 are all well known both for laser diodes and for other optically active waveguide structures and do not directly impact the invention.

According to the invention, the cleaved facets 12, 14 are cleaned and treated, as will be discussed in some detail later, and then coated with thin passivation layers 22, 24 preferably of amorphous hydrogenated silicon (a-Si:H). Optical coatings are applied over the passivation layers 22, 24. The figure is not drawn to scale. Typically, the waveguide structure 20 for a high-power laser has a width of about 2 to 7 $\mu$m, and its length between the facets 12, 14 is between 500 and 5000 $\mu$m. The thicknesses of the facet coatings are each less than 1 $\mu$m. The thickness of the passivation layers 22, 24 less than 100 nm and is preferably in the range of 10 to 60 nm so that they have relatively little effect on the approximately 1 $\mu$m laser radiation.

In one embodiment, the back facet 14 is coated with a high-reflectance (HR) mirror consisting of alternating quarter-wavelength layers 25, 26 of differing refractive index, for example, $Al_2O_3$ and Si, and the front facet 12 is coated with an anti-reflectance (AR) coating 27 of, for example, a quarter-wavelength layer of $Al_2O_3$. An AR coating is needed in this embodiment to increase the fraction of optical energy that is coupled out of the waveguide 20 into an optical output beam 28. In other applications, the front facet 12 may instead require an HR Mirror, or a partially transmitting mirror, or may not need any special optical coating.

The invention includes a method of forming the optical structure of FIG. 1 which allows the cleaving to be performed in an air ambient with the result that the facets are expected to be oxidized prior to the passivating step. After cleaving, multiple laser bars may be stacked together and loaded through a vacuum load lock 30, illustrated in the schematic illustration of FIG. 2 into an ultra-high vacuum (UV) processing system having a central transfer chamber 32. The vacuum load lock 30 can be pumped from atmospheric pressure to $10^{-7}$ Torr, while the central transfer chamber 32 preferably has a baseline pressure of less than $2\times10^{-10}$ Torr. Between the time laser bars are loaded into the system and removed after processing, they are not exposed to a higher ambient pressure but only to the controlled environments of the multiple processing steps. The transfer mechanism should preferably include means for grounding or even electrically biasing the laser bars during plasma processing.

The bars are loaded through a first chamber load lock valve 34 into a first processing chamber 36 which is preferably capable of both removing the oxide and coating the passivation layer. After the load lock 34 is closed, processing begins, as illustrated in the process flow diagram of FIG. 3, with a step 38 of cleaning the oxide from the wafer facet. The native oxide forms to a thickness of between 3 and 7 nm.

A first method of cleaning the oxide involves irradiating the bars with a ion beam of hydrogen and either argon or xenon in about equal proportions to remove the thin oxide layer. Such an ion gun is the Common Wealth Mark I, but others are available. The energy of the ions is about 50 to 80% of the anode voltage of the gun so that if the anode voltage is set to 30V, the average ion energy reaching the facet is between 15 and 24 eV. The etching rate increases from about 0.5 to 2 nm/min as the anode voltage increases from 40 to 70V, but the iron contamination similarly increases from about 0.5 to 2%. An anode voltage of 30V is recommended, at which value the iron contamination should be less than 0.2%. Because ion sputtering tends to produce differential sputtering yields for a multi-component target, the ion beam cleaning should cease once the oxide has been removed.

During the ion irradiation the GaAs substrate should be biased from a DC or RF power supply with between 50 and 100V of negative DC bias. Increased substrate bias has the same effect as increased ion energy but without the accompanying problem of sputtering the stainless steel substrate holder, which can contaminate the facet with iron, chromium, or other metals. The substrate holder should be coated with about 1 $\mu$m of silicon nitride to reduce the contamination.

An alternative, second method of cleaning the oxide is to subject the substrate to a hydrogen plasma produced by flowing between 2 and 60 sccm of $H_2$ through an electron cyclotron resonance (ECR) plasma source attached to the chamber. The gas source can be either pure $H_2$ or a $Ar/_2$ or $Xe/H_2$ mixture. The hydrogen ions have an energy distribution from 1eV. To several eV. With a maximum energy of about 20 eV. ECR sources are typically operated at 2.45 GHz and produce a hydrogen plasma with ion temperatures of less than 1 eV. With the processing chamber held at $1\times10^{-4}$ Torr and ECR power of 400 to 1000W, about 10 to 60 minutes of hydrogen treatment is required to clean the facets. The substrate is preferably electrically grounded during the ECR treatment to minimize ion damage. The temperature of the laser bar should be kept below 200° C. during treatment. The hydrogen reduces the oxides of gallium, arsenic, and aluminum and will fill the dangling bonds. Further, the hydrogen will release surface strain and decrease the interface charge density. The ECR treatment produces less damage, such as surface compositional contamination, structural change, doping, and lattice distortion.

After the facets have been cleaned, in step 40, the hydrogenated amorphous silicon (a-Si:H) passivation layers 22, 24 are deposited in the same chamber 36, preferably by a sputtering method in the presence of a hydrogen plasma, with the substrate held at a temperature below 200° C. The method has been practiced using the ECR source attached to the chamber 36 and a silicon target inside the chamber. During the passivation process, argon flows to the surface of the silicon target and sputters silicon atoms. Simultaneously, the ECR-generated hydrogen plasma, perhaps including argon or xenon, irradiates the facets. The sputtered silicon atoms will react with the hydrogen to deposit a-Si:H on the laser facets to thereby form the passivation layers. The power on the sputter gun should be kept low to minimize possibly damage to the facets by energetic argon ions. The passivation deposition is done at a pressure in the range of $2\times10^{-4}$ to $1\times10^{-6}$ Torr immediately following the facet cleaning without breaking vacuum between the steps. These pressures arise from the processing gases intentionally introduced into the chamber. The background pressure is no more than $10^{-9}$ Torr, which would be the maximum oxygen partial pressure to which the chip is exposed between the cleaning and deposition. However, to account for processing variants, the oxygen partial pressure may be specified to be no more than $10^{-8}$ Torr.

The cleaning and deposition steps 38, 40 can even be melded by beginning to bleed argon or xenon next to the silicon target at the end of the hydrogen cleaning while the silicon target is initially covered with a shield and thereafter opened when the ECR power is reduced to begin the deposition. Thereby, the freshly cleaned facets have little opportunity to reoxidize prior to being coated with the much more stable passivation layer. Even a few seconds of extinguishing the plasma at these relatively high pressures are likely to reoxidize the facets. The ECR power during sputtering is in the range of 300 to 600W, which is low enough to avoid argon or xenon damage in the deposited film.

The a-Si:H film is deposited to a thickness of between 5 and 60 nm, for example 20 nm. Hydrogenated amorphous silicon is known to have a band gap of about 1.6 eV. so that it should be transparent at the laser emission wavelength of 980 nm (~1.26 eV.).

Planar samples of a-Si:H films deposited by ECR assisted sputtering have been subjected to a number of tests. Optical tests on a deposited a-Si:H film have confirmed its transparency at 980 nm, in contrast to silicon films which have a much stronger absorption at this wavelength. The electrical resistance of the a-Si:H film is too high to be measure by a four-probe circuit.

To the limits of the measuring technique, the deposited film is free of oxygen so that oxidation of the a-Si:H passivation layer is not expected to significantly occur. Only H—Si—H bonding states rather than Si—Si states are observed. The hydrogenated silicon network is more ordered and more stable and has less stress than a pure silicon network. Raman spectroscopy shows the as deposited a-Si:H film to be amorphous. Even when irradiated with 1.27W/$\mu m^2$ of 980 nm laser radiation, it does not crystallize.

There are, however, other methods of forming the amorphous hydrogenated silicon layer, for example, ion-beam sputtering, electron-beam sputtering, or chemical vapor deposition, but ECR-assisted sputtering is preferred. However, since it is preferred to perform both the facet cleaning and passivation deposition in the same chamber, ECR or ion-beam sputtering are preferred.

The described ECR-assisted sputtering is one form of ion beam assisted (IBA) deposition in which the primary deposition technique is either physical vapor deposition (PVD) or chemical vapor deposition (CVD). Low-energy ion beams have ion energies of less than 200 eV. can be combined with the PVD techniques including e-beam sputtering, thermal evaporation, laser ablation, etc. as well as the described working gas sputtering. The low-energy ion beam performs a number of functions. It densifies the film if the ion beam includes inert gas ions such as Ar, Xe, He, etc. It improves the adhesion of the deposited film on the substrate. For some applications, low-energy ions may be used in a reactive deposition, for example, oxidizing, nitriding, or hydrogenating the coating by using a reactive beam of oxygen, nitrogen, or hydrogen ions. The low-energy ion beam may be used to modify the film structure or crystallography or change the film's stoichiometry.

Low-energy ion beams can be generated by many kinds of ion sources. The most common types of ion sources are gridless ion source (e.g. end-hall type), grid type ion sources (e.g. Kaufman guns), or the described ECR source. The ion beam energy and the ionization state (ionized or neutral) depends on the type of source.

Figure 2:
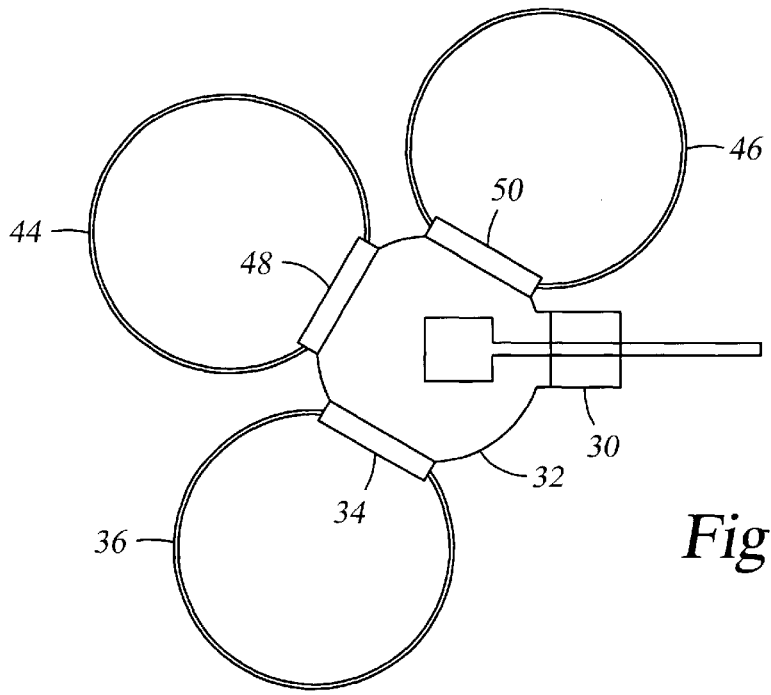
FIG. 2 is a schematic view of an integrated processing tool on the which the process of the invention can be practiced.

After the passivation layer has been deposited, as part of a step 42 of depositing the anti-reflective and highly reflective layer, the load lock valve 34 of FIG. 2 is opened and the laser bars are transferred across the transfer chamber 32 in a sequence of operations to two deposition chambers 44, 46 having respective load lock valves 48, 50. The optical coatings are of conventional structure and fabrication, usually composed of the combination of high and low refractive index coatings. The high refractive index material can be Si (n between 3.9 and 4.2), $Al_2O_3$ (between 1.6 and 1.7), $Ta_2O_5$ (n between 1.9 and 2.0), $Si_3N_4$ (n between 1.9 and 2.0), and $Nb_2O_5$ (n between 2.1 and 2.3). The low refractive index material can be $SiO_2$ or $Al_2O_3$ with Si. Reactive sputtering may be used to form the oxides or the silicon nitride, but ion beam assisted e-beam deposition is another way to produce dense and pinhole-free films. The anti-reflective coating has been implemented with $Nb_2O_5$, for which the reflectivity at 980 nm can be controlled to between 1 and 9%. The high reflectivity coating has been implemented with a symmetric structure of $(Nb_2O_5/SiO_2)^N/Nb_2O_5$, where the pair number N is either 4 or 5.

After the facet passivation, the chip may be exposed to air. Nonetheless, it is preferred to maintain the chip at vacuum in the transfer chamber 32 between the passivating and optical coating steps so as to minimize the pump down times during a production run. It would be possible to perform the passivation and the optical coating in completely separated chambers.

Figure 3:
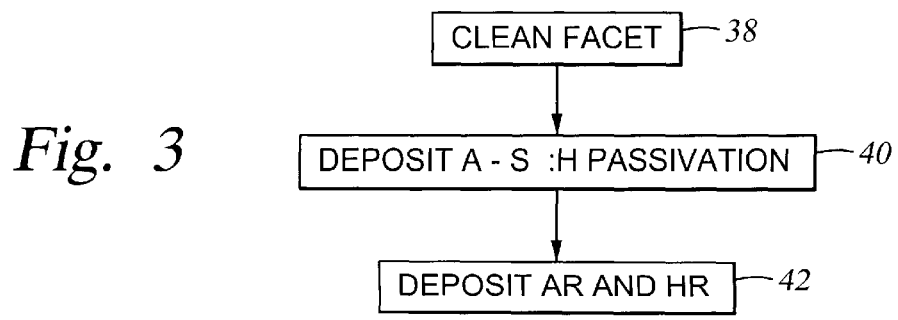
FIG. 3 is a flow diagram of four processing steps of treating and coating laser facets according to the invention.

After completion of the sequence of FIG. 3, the bars are removed from the system and mounted on suitable structures, electrically contacted, and packaged, all of which are well known in the field of edge-emitting semiconductor lasers.

Alcelerated life tests have been performed at 80° C. and 300 mA of constant biasing for lasers fabricated with barrier layers either of the hydrogenated amorphous silicon of the invention or of undoped silicon. The laser of the invention is shown to have an optical power output that drops gradually over about 600 hours (which is believed equivalent to 7000 hours of room temperature operation). The laser using a conventional pure silicon barrier has an initially higher optical output, but at 120 hours its output falls below that of the inventive laser, and at 220 hours it suffers catastrophic optical damage and no longer works.

Although the invention has been described in the context of diode lasers, there are other semiconductor optical devices that are similarly subject to catastrophic damage due to high-power optical radiation reflected from or transmitted through their facets. Examples include optically pumped semiconductor lasers and optical amplifiers, perhaps forming part of a laser cavity extending outside of the chip. The different types of optical devices will have different optical coatings applied to their facets.

The invention thus provides an effective but straightforward method of producing a laser or other optical device with passivation layers that reduce if not eliminate catastrophic damage when operated at high optical power levels.

What is claimed is:

1. An edge-emitting semiconductor optical device comprising:
   a compound semiconductor substrate having a waveguide structure formed on said substrate for generating light at an operating wavelength;
   a pair of air-cleaved facets cleaved in ambient air from the compound semiconductor substrate and formed on opposed faces of said waveguide structure;

native oxide layers formed on said air-cleaved facets from oxidation of said facets with said ambient air;

hydrogen having a low energy less than 24 eV. applied in a vacuumed system to remove said native oxide layers from said air-cleaved facets and to hydrogenate said air-cleaved facets to form hydrogenated facets;

silicon applied in said vacuumed system wherein said silicon is hydrogenated with said hydrogen to form hydrogenated silicon, such that the molecular hydrogen is directly bonded to the silicon atoms for providing transparency at said operating wavelength;

passivation layers formed on said hydrogenated facets from deposition of the hydrogenated silicon on said hydrogenate facets, which passivation layers are essentially unoxidized, comprising respective layers comprising hydrogenated amorphous silicon; and a reflective coating formed directly over at least one of said passivation layers.

2. The device of claim 1, wherein said hydrogenated amorphous silicon has a high resistance greater than measurable by a four-probe electrical resistance circuit.

3. The device of claim 2, wherein said waveguide structure is capable of emitting radiation at said operating wavelength of 980 nm and having said hydrogenated amorphous silicon at a thickness less than 20 nm.

4. The device of claim 1, wherein said waveguide structure supports multiple lateral modes for providing high tower lapsing at greater than 100 mW.

5. The device of claim 1, wherein in one of said reflective coatings is an anti-reflective coating and the other of said reflective coatings is a highly reflective coating to forth a laser for providing high power lapsing at greater than 100 mW.

6. A method of forming and passivating faces of an edge-emitting semiconductor optical device prior to reflective deposition, the method of forming and passivating comprising the steps of:

cleaving along said faces in ambient air for separating a compound semiconductor substrate into at least one chip having opposed air-cleaved facets between which runs an optical waveguide structure for Generating light at an operating wavelength;

forming a native oxide layer on said opposed air-cleaved facets from oxidation of said facets with said ambient air;

placing said chip into a vacuum processing system;

removing said native oxide layer from each of said facets and hydrogenating said air-cleaved facets by applying hydrogen in said vacuum processing system to form hydrogenated facets;

applying silicon in said vacuum processing system for hydrogenating silicon with said hydrogen to form hydrogenated silicon; and coating each of said hydrogenated facets directly with a respective passivation layer of hydrogenated amorphous silicon from deposition of said hydrogenated silicon, wherein the molecular hydrogen is directly bonded to the silicon atoms for providing transparency at said operating wavelength, said coating step being performed after said removing step without between said two steps exposing said chip to a partial pressure of oxygen of greater than a maximum background pressure amount in said vacuum processing system.

7. The method of claim 6, further comprising, after said placing step into said vacuum processing system which includes a first chamber having said maxim background pressure amount about $10^{-8}$ Torr, vacuum sealing a entrance into said chamber through which substrate is passed and wherein said removing and coating steps are performed while said entrance remains vacuum sealed.

8. The method of claim 7, wherein said removing and coatings steps are performed while said at least one chip is disposed at a first position in said chamber.

9. The method of claim 6, wherein said coating step causes said passivation layers to be formed to thickness in a range of 5 to 20 nm at said operating wavelength of about 980 nm.

10. The method of claim 6, wherein said removing step includes irradiating said chip with an ion beam of hydrogen.

11. The method of claim 10, wherein said ion beam additionally includes at least one of argon and xenon.

12. The method of claim 6, wherein said removing step includes exposing said chip to a plasma of hydrogen having low energy around 1–10 eV.

13. The method of claim 12, wherein said plasma additionally includes at least one of argon and xenon while the plasma of hydrogen flow is between 2 and 60 sccm.

14. The method of claim 12, wherein said plasma continues unextinguished during and between said removing and coating steps.

15. The method of claim 14, wherein said applying silicon step includes sputtering a silicon target.

16. The method of claim 6, wherein said coating step includes ion-beam assisted deposition.

17. The method of claim 6, wherein said removing step comprises ion-beam assisted deposition which includes providing hydrogen ions having an energy of less than 200 eV.

18. The method of claim 16, wherein said coating step includes chemical vapor deposition.

19. The method of claim 16, wherein said coating step includes physical vapor deposition.

20. The method of claim 19, wherein said applying silicon step comprises the steps of:

flowing a working gas comprising a noble gas into said vacuum processing system;

electrically biasing said chip to provide a biased chip; sputtering a target comprising silicon to excite said working gas into a plasma to sputter said biased chip; and flowing hydrogen into said vacuum process system.

21. The method of claim 20, wherein said flowing step includes flowing said hydrogen through an electron cyclotron resonance source to excite said hydrogen into a hydrogen plasma having low energy around 1–10 eV.

22. A method of forming and passivating faces of an edge-emitting semiconductor optical device prior to reflective deposition, the method of forming and passivating comprising the steps of:

cleaving along said faces in ambient air for separating a compound semiconductor substrate into at least one chip having opposed air-cleaved facets between which runs an optical waveguide structure for generating light at an operating wavelength;

forming a native oxide layer on said opposed air-cleaved facets from oxidation of said facets with said ambient air;

removing said native oxide layer from each of said facets while said facets are exposed to ionized hydrogen having a low energy level in a vacuum processing system and hydrogenating said air-cleaved facets to form hydrogenated facets;

applying silicon in said vacuum processing system for hydrogenating silicon with said hydrogen to form hydrogenated silicon; and coating directly each of said hydrogenated facets with a respective passivation layer comprising hydrogenated amorphous silicon from deposition of said hydrogenated silicon wherein the molecular hydrogen is directly bonded to the silicon atoms for providing transparency at said operating wavelength.

23. The method of claim 22, wherein said removing step includes irradiating said chip with an ion beam of hydrogen having low energy below 24 eV.

24. The method of claim 23, wherein said ion beam additionally includes at least one of argon and xenon.

25. The method of claim 22, wherein said removing step includes exposing said chip to a plasma of hydrogen having low energy around 1–10 eV.

26. The method of claim 25, wherein said plasma additionally includes at least one of argon and xenon and the plasma of hydrogen is flowing between 2 and 60 sccm.

27. The method of claim 25, wherein said plasma continues unextinguished during and between said removing and coating steps.

28. The method of claim 22, wherein said coating step causes said passivation layers to be formed to thicknesses below 20 nm at said operating wavelength about 980 nm.

29. The method of claim 22, wherein said coating step comprises sputtering.

30. The method of claim 29, wherein said coating step comprises the steps of:

flowing a gas comprising hydrogen and a noble working gas into si a chamber; and electrically biasing said chip to provide a biased chip;

sputtering a target comprising silicon to excite said working gas into a plasma to sputter said biased chin.

31. The method of claim 22, wherein between said removing and coating steps said chip is not exposed to a partial pressure of oxygen of greater than $10^{-8}$ Torr.

32. A method of forming and passivating faces of an edge-emitting semiconductor optical device prior to reflective deposition, the method of forming and passivating comprising the steps of:

cleaving in ambient air a compound semiconductor substrate along said faces into at least one chip having opposed air-cleaved facets between which runs an optical waveguide structure for generating light at an operating wavelength;

forming a native oxide layer on said opposed air-cleaved facets from oxidation of said facets with said ambient air;

placing said cleaved substrate into a vacuum processing chamber;

flowing hydrogen through an electron cyclotron resonance (ECR) source into said chamber to form a low energy hydrogen plasma in said chamber at around 1–20 eV.;

continuing said flowing step a sufficient time to clean said facets through removing said native oxide layer from each of said facets and hydrogenating said air-cleaved facets to form hydrogenated facets;

after said sufficient time, sputtering a target comprising silicon in said chamber while continuing said flowing step to form an a hydrogenated amorphous silicon layer directly on said hydrogenated facets through deposition of hydrogenated silicon, wherein the molecular hydrogen is directly bonded to the silicon atoms for providing transparency at said operating wavelength.

33. The method of claim 32, wherein said flowing step additionally flows at least one of argon and xenon through said ECR source into said chamber having said low energy hydrogen plasma at around 1–10 eV. With hydrogen flowing between 2 and 60 sccm.

34. The method of claim 32, farther comprising negatively DC biasing said chip during said sufficient time.

35. The device of claim 1, wherein said respective layers have thickness below, 20 nm at said operating wavelength about 980 nm.

36. The device of claim 1, wherein said reflective coating comprises multiple pairs of two quarter-wavelength layers of two respective materials having different refractive indices.

37. The device of claim 36, wherein said two materials respectively comprise $Al_2O_3$ and Si.

* * * * *

UNITED STATES PATENT AND TRADEMARK OFFICE
CERTIFICATE OF CORRECTION

PATENT NO. : 6,618,409 B1
DATED : September 9, 2003
INVENTOR(S) : Martin Hu et al.

It is certified that error appears in the above-identified patent and that said Letters Patent is hereby corrected as shown below:

<u>Title page</u>,
Item [74], *Attorney, Agent, or Firm*, "Juliana Agan" should read -- Juliana Agon --

<u>Column 2</u>,
Line 7, "tower lapsing" should be -- power lasing --
Line 32, "Forth" should be -- form --
Line 33, "Lapsing" should be -- lasing --
Line 42, "Generating" should not be capitalized <u>Column 9</u>,
Line 32, "si" should be deleted.
Line 36, "chin" should be -- chip --

<u>Column 10</u>,
Line 21, delete "an"
Line 31, "farther" should be -- further --

Signed and Sealed this

Twenty-seventh Day of April, 2004

JON W. DUDAS
*Acting Director of the United States Patent and Trademark Office*